United States Patent [19]

Evans, Jr.

[11] 4,104,084
[45] * Aug. 1, 1978

[54] SOLAR CELLS HAVING INTEGRAL COLLECTOR GRIDS

[75] Inventor: John C. Evans, Jr., N. Olmsted, Ohio

[73] Assignee: The United States of America as represented by the Administrator of the National Aeronautics and Space Administration, Washington, D.C.

[*] Notice: The portion of the term of this patent subsequent to Apr. 4, 1995, has been disclaimed.

[21] Appl. No.: 803,823

[22] Filed: Jun. 6, 1977

[51] Int. Cl.² ............................................. H01L 31/06
[52] U.S. Cl. ............................. 136/89 CC; 136/89 SJ; 357/15; 357/16; 357/30; 357/65; 357/67
[58] Field of Search ...................... 136/89 CC, 89 SJ; 357/15, 16, 30, 65, 67

[56] References Cited

U.S. PATENT DOCUMENTS

| | | | |
|---|---|---|---|
| 3,350,775 | 11/1967 | Iles | 29/572 |
| 3,431,150 | 3/1969 | Dolan, Jr. et al. | 148/1.5 |
| 3,493,822 | 2/1970 | Iles | 317/234 |
| 3,990,914 | 11/1976 | Weinstein et al. | 136/89 |

Primary Examiner—Aaron Weisstuch
Attorney, Agent, or Firm—N. T. Musial; J. R. Manning; G. E. Shook

[57] ABSTRACT

A heterojunction or Schottky barrier photovoltaic device comprising a conductive base metal layer compatible with and coating predominately the exposed surface of the p-type substrate of the device such that a back surface field region is formed at the interface between the device and the base metal layer, a transparent, conductive mixed metal oxide layer in integral contact with the n-type layer of the heterojunction or Schottky barrier device having a metal alloy grid network of the same metal elements of the oxide constituents of the mixed metal oxide layer embedded in the mixed metal oxide layer, an insulating layer which prevents electrical contact between the conductive metal base layer and the transparent, conductive metal oxide layer, and a metal contact means convering the insulating layer and in intimate contact with the metal grid network embedded in the transparent, conductive oxide layer for conducting electrons generated by the photovoltaic process from the device.

19 Claims, 8 Drawing Figures

SOLAR CELLS HAVING INTEGRAL COLLECTOR GRIDS

ORIGIN OF THE INVENTION

The invention described herein was made by an employee of the United States Government and may be manufactured or used by or for the Government without the payment of any royalties thereon or therefor.

BACKGROUND OF THE INVENTION

1. Field of the Invention

The present invention relates to solar cells having integral collector grids in heterojunction as well as Schottky barrier devices. More particularly, the present invention relates to photovoltaic devices of the heterojunction and Schottky barrier type which possess a metallic collector grid system as an integral part of a conductive transparent mixed metal oxide on the photovoltaic substrate.

2. Description of the Prior Art

Solar cells utilizing heterojunctions such as $Ga_{1-x}Al_x$-As-GaAs, ZnSe-GaAs, GaP-Si and ZnS-Si or Schottky barriers such as those in which a thin film of metal such as platinum, gold, silver or the like is deposited on a semiconductor substrate are well known. nZnSe-pGaAs heterojunction devices have been prepared by vapor growth as well as solution techniques. However, the conversion efficiency of these devices is low because of the high doping levels of GaAs required and because of the high series resistance attributable to the high resistivity of ZnSe. GaP-Si heterojunction devices have been prepared, but a major problem is that when the devices are cooled from growth temperature, cracks develop in the devices because of the stress caused by thermal expansion differences between GaP and Si.

Since silicon represents the most highly developed semiconductor technology, it is the most promising basic material for the fabrication of practically useful solar cells. Heterojunction Si solar cells are known in which $SnO_2$, $In_2O_3$, CdS or GaP is deposited on n- or p-Si. Efficiencies of up to 10% can be achieved with $SnO_2$ deposited on n-type Si, close to 6% with CdS deposited on p-type Si and as high as 12% with $In_2O_3$ deposited on p-type Si. While the heterojunction Si solar cell devices have no surface dead layer which is caused by low-lifetime, highly doped, diffused regions, and while processing of the devices are simpler as well as amenable to continuous-flow manufacture, it is critically important to control the junction interface to achieve optimum performance.

Schottky barrier silicon cells are potentially effective as solar cell devices because they feature good short wavelength response characteristics and they do not require processing at elevated temperature. Moreover, efficiencies of up to 8% have been obtained with devices containing aluminum as the barrier metal and even higher efficiencies (up to 8.6%) with chromium as the barrier metal.

Recently, potentially valuable types of heterojunction and Schottky barrier type solar cells have received increased interest, and these cells involve the use of transparent conducting glasses such as $In_2O_3$, $SnO_x$, ZnO and the like as coatings on solar cell devices. It has been suggested to use such materials in the manufacture of heterojunction devices with p-type semiconductors or Schottky barriers with n-type semiconductors. These metal oxide materials have the desirable characteristic of having high transparency which is usually above 90% at layers of several thousand Å to about one micron in thickness and their resistivities in the form of a sheet can be very low. Such metal oxides can also be applied by evaporation, spraying and sputtering techniques onto a suitable substrate. Moreover, the metal oxides are potentially very economical from cost and energy consumption viewpoints. In fact, some solar cell devices have been manufactured of both the heterojunction and Schottky barrier type in which $SnO_2$ is deposited on Si and GaAs substrates. However, the efficiencies of the devices are poor, i.e., about 1%, probably because of the poor quality of the $SnO_2$ films or because of detrimental energy barriers at the interface of the devices.

Anderson in *Applied Physics Letters*, 27(12), (1975), 691–693, has described heterojunction solar cells in which a thin insulating layer such as $SiO_2$ is disposed at the material interface. The reference shows heterojunction photovoltaic cells which have the structure, n-$In_2O_3$/I/p-Si in which an intermediate $SiO_2$ layer exhibits insulating characteristics. It has been found that the intermediate $SiO_2$ layer increasingly suppresses photocurrent at increasing illumination intensity and at increasing interfacial thicknesses. Although the presence of such an intermediate layer increases the conversion efficiency of solar cells at low illumination intensities, the fact that the $SiO_2$ layer suppresses the photocurrent generated by the device obviates its use in systems which use appreciable solar concentration.

Wang et al, *Proceed. of the 12th Photovoltaic Specialists Conference*, Baton Rouge, La., Nov. 15–18 (1976), have disclosed $SnO_2$-Ge and $SnO_2$-GaAs heterojunction devices which exhibit photovoltaic characteristics. Moreover, conducting glass-silicon heterojunction solar cell devices in which $SnO_2$, $In_2O_3$ and mixtures of $In_2O_3$ and $SnO_2$ are used as conducting glasses are known. The oxide semiconductor coatings possess good electrical cnductivity and high optical transparency. Because the index of refraction of the oxide films falls between that of air and the semiconductor substrate, the oxide semiconductor not only serves as a part of the heterojunction, but also as an antireflection coating. The oxide semiconductor heterojunction devices also have the potential advantages over conventional homojunction solar cells such as low temperature diffusion-less fabrication, shallow junction depth and better radiation resistance.

Another known photovoltaic device consists of a silicon substrate provided with a conductive, transparent layer of $SnO_2$. Usually, the tin oxide coating is deposited on the substrate by sputtering or evaporation of tin onto the substrate and then oxidizing the metal layer by some convenient technique. However, while a number of heterojunction and Schottky barrier devices are known, which possess photovoltaic activity including a number which possess a transparent conductive metal oxide coating, and which have surface collector grids in contact with the active metal oxide layer, a need continues to exist for a method by which photovoltaic devices can be fabricated in which the transparent, conductive metal oxide coating of such devices is not only a conductive sheet, but also possess bulk metal collector grids within the oxide layer in intimate contact with the initial oxide layer in contact with the semiconductor substrate of the photovoltaic device.

SUMMARY OF THE INVENTION

Accordingly, one object of the present invention is to provide improved photovoltaic heterojunction or Schottky barrier type devices which possess a transparent, conductive coating in which metal conductors are an integral part and in intimate contact with the metal oxide structure which coats the devices.

Another object of the present invention is to provide a method for fabricating Schottky barrier or heterojunction based photovoltaic devices which possess a metal collector grid system in integral and intimate contact with the transparent conductive oxide coating on the devices.

Briefly, these objects and other objects of the present invention as hereinafter will become more readily apparent can be attained by a heterojunction or Schottky barrier photovoltaic device comprising:

a heterojunction or Schottky barrier device;

a conductive base metal layer compatible with and coating predominately the exposed surface of the p-type substrate of said device such that a back surface field region is formed at the interface between said device and said base metal layer;

a transparent, conductive mixed oxide layer in integral contact with the n-type layer of said heterojunction device or Schottky barrier device having a metal alloy grid network of the same metal elements of the oxide constituents of said mixed metal oxide layer embedded in said mixed metal oxide layer;

an insulating layer which prevents electrical contact between said conductive metal base layer and said transparent conductive metal oxide layer; and a metal contact means covering said insulating layer and in intimate contact with said metal grid network embedded in said transparent oxide layer for conducting electrons generated by the photovoltaic process from said device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein like reference numerals designate identical or corresponding parts throughout the several views and wherein.

DETAILED DESCRIPTION OF THE PREFERRED EMBODIMENT

The photovoltaic devices of the present invention are heterojunction or Schottky barrier devices which possess an integral mixed metal oxide coating in which is embedded a metallic network which functions as an efficient collector for electrons set in motion by the photovoltaic process. The metal grid system is formed from the metal elements of the transparent, conductive mixed metal oxide coating which is in contact with the oxide coating which constitutes the barrier of the devices with the semiconductor substrate.

Figure 1:
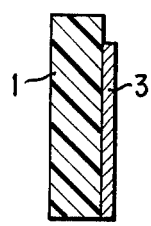
FIG. 1 represents the view of a silicon semiconductor substrate 1 provided on one side with a conductive metal layer 3.

Reference is now made to the accompanying figures in order to more satisfactorily explain the technique of the present invention. For sake of expediency, the method of the present invention in conjunction with FIGS. 1 - 6 and 8 will be described in terms of a silicon-$In_2O_3/SnO_2$ heterojunction device. In the preparation of the device, the silicon substrate 1 is properly cleaned in order to remove any surface oxide. This is most commonly done by etching the substrate with hydrofluoric acid solution. The substrate is then rinsed with a solvent such as acetone or methanol or even deionized water and then dried under an inert atmosphere such as nitrogen or an inert gas. Besides cleaning the silicon substrate, the etching treatment provided roughened surfaces on silicon substrate 1 to which subsequently applied films can more strongly adhere. FIG. 1 shows a cleaned silicon semiconductor substrate 1 on which is deposited a metal layer 3 which is compatible with a p-type substrate such as silicon. The metal of choice in most applications is aluminum. The metal layer 3 is deposited by any well known deposition technique such as sputtering, vacuum deposition or the like over most of one of the cleaned surfaces of substrate 1 to a depth usually ranging from 3 to 5μm. A simple window mask can be employed to define the area to be covered although a conventional photoresist mask could be used equally as well. The composite is then sintered in a nitrogen atmosphere at a temperature ranging from about 800° to 850° C for a time sufficient to form a diffused region in which a portion of the metal layer 3 diffuses into the substrate 1. Such a region is commonly referred to as a back surface field region. The back surface field region forms an electric field in the solar cell which contributes to the conversion efficiency of the cell. Back contact can then be made to layer 3 via a conductive lead.

Figure 2:
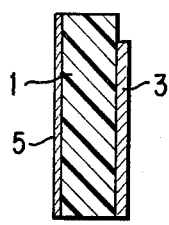
FIG. 2 represents the assembly of FIG. 1 which is provided with an alloy layer 5 on the surface opposite conductive metal layer 3.
Figure 3:
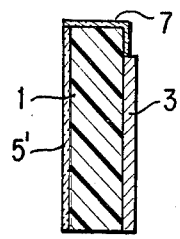
FIG. 3 represents the assembly of FIG. 2 in which alloy layer 5 has been converted to mixed metal oxide layer 5' and is provided with insulating layer 7.
Figure 4:
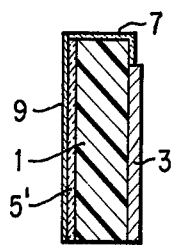
FIG. 4 represents the assembly of FIG. 3 with the addition of alloy layer 9 to mixed metal oxide layer 5'.

After formation of the metal layer 3, the opposite side of the cleaned substrate (1) is provided with a semiconductive metal oxide layer to complete the formation of the heterojunction layers. This is accomplished by depositing a mixed metal layer 5 on the available surface of the silicon substrate and then oxidizing layer 5 to mixed metal oxide layer 5' as shown in FIGS. 2 and 3. Mixed metal layer 5 is deposited by any conventional technique such as vacuum sputtering, evaporation or the like through a window mask. Alternatively, the side of the substrate coated with metal layer 3 can be coated with a protective material such as a hydrocarbon wax of low vapor pressure e.g. Apiezon Wax, or a thermoplastic cement soluble in alcoholic solvents, e.g. de Khotinsky cement. After the mixed metal layer 5 is deposited by whatever means desired, the edges of the wafer are cleaned and freed of any mixed metal material. An aqueous acidic solution such as a hydrofluoric acid soluion is satisfactory for this purpose. Suitable metals or mixed metals which can be deposited as layer 5 preferably include indium-tin, as well as tin. The metal or mixed metal layer can be deposited to a thickness ranging from 600 Å to 4000 Å.

After alloy layer (5) has been deposited to a depth normally ranging from about 600 Å to 4000 Å, the layer is oxidized to a mixed metal oxide simply by exposing the alloy layer to an oxidizing atmosphere while being heated. While the method by which the alloy layer is oxidized to form a transparent, conductive layer such as $In_2O_3$-$SnO_2$ is not critical, a gaseous oxidant such as air, oxygen, moist air or an oxygen gas mixture is normally allowed to flow over the alloy layer surface while the device is heated from the aluminum layer (3) side by any convenient means such as a hot plate or stove or blasts of hot air from a heater normally to a temperature of about 400° to 700° C. After the semiconductor layer 5' is formed, the device can be provided with insulating layer 7 which coats an edge portion of the substrate 1 thus providing an insulated area between back layer 3 and oxide layer 5'. In the preparation of insulating layer 7, the device is masked by any conventional technique such as photoresist masking or the like. Insulating layer 7 can be any appropriate insulating glass which provides effective, long-life insulation and which for all practical purposes is silica. The silica can be applied by any satisfactory means for coating a substrate with $SiO_2$ such as vacuum evaporation, sputtering, or the like. However, a preferred method of application is to apply the $SiO_2$ in the form of a finely granulated glass frit suspended in a polymeric binder such as polyvinyl alcohol. The device is then heated to decompose and volatilize the organic component at a temperature suitable for the complete removal of all organics. No matter what method is used to form insulating layer 7, a dense layer of $SiO_2$ is formed.

In the next step of the preparation the mixed metal oxide layer 5' of the device is masked by any convenient manner described above and a layer 9 of a suitable metal alloy is applied to the oxide layer in the manner described above as shown in FIG. 4. The layer is usually applied to a thickness ranging from about 500 Å to 10μm. Generally an alloy is chosen which has an oxidation temperature lower than that used for the formation of the semiconductive oxide layer 5' which completes formation of the heterojunction layers. Suitable mixed metals include indium-tin, indium-antimony, and the like.

After the alloy layer 9 has been formed, it is subjected to an oxidation process in the manner described in copending U.S. application Ser. No. 770,869, now U.S. Pat. No. 4,082,569 (NASA Case No. 12,552-1), herein incorporated by reference, whereby not only is the second alloy layer 9 oxidized to oxide layer 9' as shown in FIG. 5, but oxidation within the layer is prevented in regions of layer 9 such that a grid structure of metal alloy channels is formed within the oxide layer 9 thus providing a conductive grid of metal within the conductive, transparent layer 9 for the efficient collection of photoenergized electrons.

Figure 6:
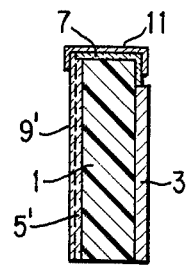
FIG. 6 represents the assembly of FIG. 5 wherein insulating layer 7 is provided with overlapping metal layer 11.

The photovoltaic device of the present invention is completed by forming a metal contact layer 11 on the insulated layer 7 of the device as shown in FIG. 6 to complete electrical contact with the conductive metal alloy grid network in layer 9'. The formation of the wraparound metal contact layer can be performed by any convenient means of depositing a conductive metal or metal alloy onto insulative layer 7. Representative techniques are disclosed in U.S. Pat. Nos. 3,493,822 and 3,350,775, herein incorporated by reference. Thus, suitable methods include providing the solar cell device with masking, i.e., photoresist, a conventional mask or the like, so only the area of the device designated as 11 is exposed. A low resistance metal such as silver, titanium-silver, chromium-copper, gold, manganese-silver, or the like is then deposited by a sputtering, vacuum evaporation or the like technique. Usually, the thickness of layer 11, while not critical, is on the order of a few micrometers up to about 10μm. Another technique of applying metal wraparound layer 11 involves the deposition by evaporation or sputtering a mixed indium-tin layer through a mask onto insulation layer 7 by rotating the solar cell under a mask over the metal source. A preferred method of applying metal wraparound layer 11 involves the silk screen printing of a conductive metal-glass paste. The commercially available metal-glass pastes generally contain conductive metal particles of gold or silver in an organic binder. When the metal paste is applied via silk screen printing, it is applied to a depth sufficient to form a conductive contact, normally of a thickness from several micrometers up to about 15μm. After the metal paste has been applied to the cell, it is fired to a sufficient temperature to destructively volatilize the organic vehicle leaving the metal wraparound layer 11 on the solar cell.

It should be understood that many other types of heterojunction devices can also be employed for the fabrication of the photovoltaic devices of the present invention. Thus, suitable heterojunction devices of two different semiconductors corresponding to substrate 1 and layer 5' in FIGS. 1-6 can be employed which include CdS-$Cu_2$S, Si-GaP, CdSe-$Cu_2$S, GaAs-ZnSe and GaAs-$SnO_2$ structures. When such devices are used, mixed metal oxide layer 9' containing conductive alloy channels 29 can be formed directly on the n layer of the heterojunction device although an intervening transparent, semiconductive metal oxide layer such as $SnO_2$ can be formed between the n layer of the device and the collector layer 9'. The photovoltaic devices of the present invention can also be formulated from Schottky barrier devices whose semiconductive layer and metal layer correspond to layers 1 and 5' respectively and include those of the structure: Si-Au, Si-Pt, GaAs-Al, GaAs-Ag and Si-Ag. As in the case of the heterojunction devices, the collector layer 9' can be deposited directly on the metal layer of the Schottky device over the semiconductive substrate. However, it is also possible to provide an intervening transparent, semiconductive metal oxide layer such as $SnO_2$ between collector layer 9' and the metal layer of the Schottky device. The heterojunction device or Schottky barrier device selected is also provided with a metal base layer 3 which is compatible with the semiconductive substrate of the device it contacts.

Figure 5:
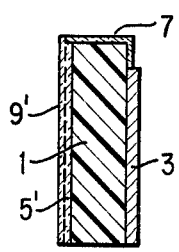
FIG. 5 represents the assembly of FIG. 4 in which alloy layer 9 is converted to mixed metal oxide layer 9'.
Figure 7:
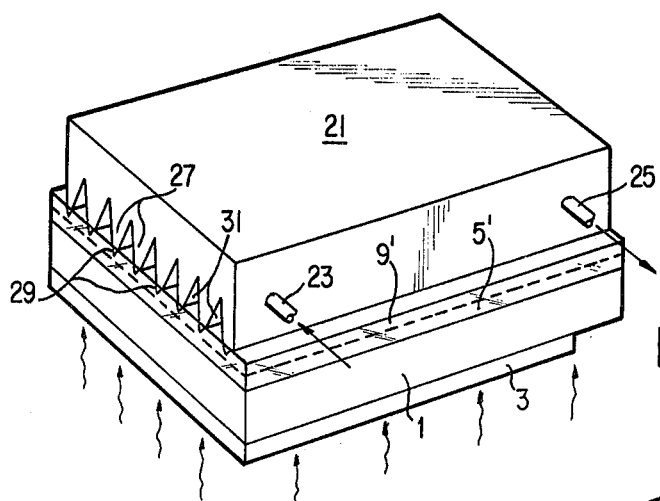
FIG. 7 shows the heat sink 21 device used to form conductive alloy channels in the mixed metal oxide layer on a semiconductor substrate.

The procedure discussed supra with reference to the oxidation step in FIG. 5 can be better appreciated by reference to FIG. 7. As shown in FIG. 7, heat sink 21 fabricated from a metal which readily conducts heat such as copper, silver, gold, platinum or the like is placed upon In-Sn alloy layer 9 such that the protruding portions 27 of the sink 21 are in intimate contact with the alloy layer. Protruding portions 27 are in a pattern which is of the same shape desired for the conductive alloy channels 29 in the resultant oxide layer 9'. Void spaces 31 exist between protruding portions 27 and, in fact, help to define the pattern of protruding portions 27 in sink 21. Heat sink 21 is also provided with a coolant inlet 23 and coolant outlet 25 which are in flow communication with an open cavity (not shown) within sink 21. The most practical and common coolant is water although any other non-corrosive fluid is satisfactory which satisfactorily conducts heat away from the heat sink. Oxidation of alloy layer 9 to mixed metal alloy layer 9' is accomplished by allowing a gaseous oxidant such as air, moist air, oxygen, oxygen-inert gas mixtures to flow through the void spaces 31. Simultaneously, the device is heated from the underlying surface of the device, i.e., the side of the layer 3 of the device to a temperature in the range of 400° to 700° C. Wherever protruding portions 27 contact alloy layer 9, oxidation of alloy layer 9 to mixed metal oxide layer 9' is prevented thereby creating metal alloy channels 29 within oxide layer 9'. Oxidation is prevented because heat is conducted away from layer 9 wherever the layer is in contact with the heat sink and therefore the temperature necessary to initiate and conduct oxidation is not achieved in these regions. In fact, the depth of the alloy channels 29 in layer 9' is indicative of those areas of alloy layer 9 which never reach the minimum temperature necessary for oxidation. Heat can be applied to the device to initiate and complete oxidation from any convenient source such as a hot air gun, hot plate, or the like. In some instances, it may not be necessary to force the gaseous oxidant through the void spaces 31 in the heat sink 21 since sufficient air will be present to achieve complete oxidation.

Figure 8:
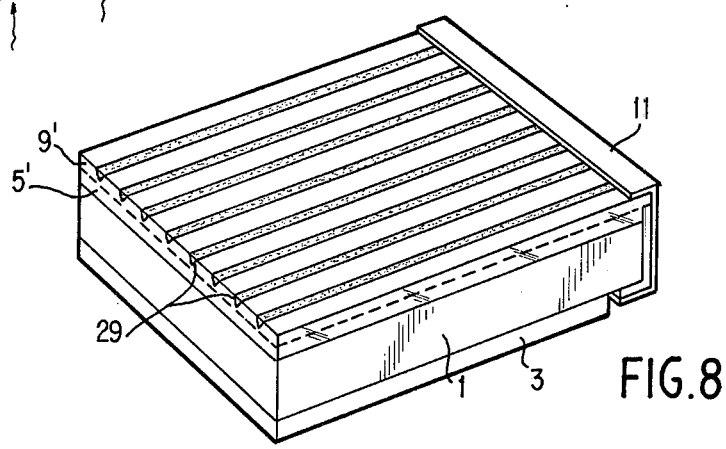
FIG. 8 shows an embodiment of a pattern of conductive alloy channels in the photovoltaic device of the present invention.

FIG. 8 shows an embodiment of a heterojunction or Schottky barrier device prepared by the process of the present invention. The device shown reveals a pattern of conductive alloy channels 29 in the covering oxide layer 9' which are in conductive contact with metal wraparound layer 11 and represents only one embodiment of different types of patterns of conductive channels which could readily be envisioned by the skilled artisan.

The present heterojunction or Schottky barrier devices find widespread use in applications where sunlight is converted to electrical energy.

Having now fully described this invention, it will be apparent to one of ordinary skill in the art that many changes and modifications can be made thereto without departing from the spirit or scope of the invention as set forth herein.

What is claimed as new and intended to be secured by Letters Patent is:

1. A heterojunction or Schottky barrier solar cell which comprises;
    a heterojunction or Schottky barrier device, each having opposed upper and lower surfaces;
    a conductive base metal layer compatible with and coating predominantly the lower surface of the substrate of each said device such that a back surface field region is formed at the interface between each said device and said base metal layer;
    a transparent, conductive mixed metal oxide layer in integral contact with the upper surface of said heterojunction device or said Schottky barrier device and having a metal alloy grid network composed of the same metal elements as the oxide constituents of said mixed metal oxide layer, said network being embedded in said mixed metal oxide layer;
    an insulating layer which prevents electrical contact between said conductive metal base layer and said transparent conductive metal oxide layer; and
    a metal contact means covering said insulating layer and in intimate contact with said metal grid network embedded in said transparent oxide layer for conducting electrons generated by the photovoltaic process from said device.

2. The solar cell of claim 1, wherein said heterojunction device is a p-type silicon substrate in contact with an n-type transparent, semiconductive oxide layer of $SnO_2$ or a mixture of $In_2O_3$ and $SnO_2$.

3. The solar cell of claim 1, wherein said mixed metal oxide layer ranges from 500 Å to 10μm thick.

4. The solar cell of claim 1, wherein said conductive metal base layer is aluminum.

5. The solar cell of claim 1, wherein said conductive metal base layer is 3μm to 5μm thick.

6. The solar cell of claim 1, wherein said transparent, conductive mixed metal oxide layer is a mixture of $In_2O_3$-$SnO_2$.

7. The solar cell of claim 6, wherein said conductive metal grid network is an In-Sn alloy.

8. The solar cell of claim 7, wherein said metal grid network ranges in depth from 500 Å to 10μm in said conductive mixed metal oxide layer.

9. The solar cell of claim 1, wherein said insulating layer is formulated of $SiO_2$.

10. The solar cell of claim 1, wherein said metal contact means is of silver, gold, titanium-silver, chromium-copper or manganese-silver.

11. The solar cell of claim 1, wherein said heterojunction device has a $CdS$-$Cu_2S$, Si-GaP, $CdSe$-$Cu_2S$, GaAs-ZnSe or GaAs-$SnO_2$ structure.

12. The solar cell of claim 1, wherein said Schottky barrier device has an Si-Au, Si-Pt, GaAs-Au, GaAs-Al, GaAs-Ag or Si-Ag structure.

13. A Schottky barrier or heterojunction solar cell which comprises:
    a heterojunction or Schottky barrier device, each having opposed upper and lower surfaces;
    a conductive metal base layer on the lower surface of the substrate of each said device such that a back surface field region is formed at the interface between each said device and said metal base layer;
    a transparent, conductive mixed metal oxide layer in integral contact with the upper surface of said device;
    a metal alloy grid network embedded within the mixed metal oxide layer, said metal alloy grid network being composed of the same metal elements of the oxide constituents of said mixed metal oxide layer;
    an insulating layer between said conductive metal base layer and said transparent conductive metal oxide layer; and
    a wraparound metal conductor which coats said insulating layer thereby providing a conductive metal collector for said embedded alloy grid network.

14. The solar cell of claim 13 wherein said heterojunction device is an n-type transparent, semiconductive layer of $SnO_2$ or a mixture of $SnO_2$ and $In_2O_3$ on a p-type Si substrate.

15. The solar cell of claim 13, wherein said conductive base metal layer is aluminum of a thickness ranging from 3μm to 5μm.

16. The solar cell of claim 14, wherein said insulating layer is $SiO_2$.

17. The solar cell of claim 13, wherein said metal alloy grid network is indium-tin or indium-antmony and wherein said metal alloy grid is of a thickness ranging from 500Å to 10μM.

18. The solar cell of claim 13, wherein said heterojunction device has a $CdS$-$Cu_2S$, Si-GaP, $CdSe$-$Cu_2S$, GaAs-ZnSe or GaAs-$SnO_2$ structure.

19. The solar cell of claim 13, wherein said Schottky barrier device has an Si-Au, Si-Pt, GaAs-Au, GaAs-Al, GaAs-Ag or Si-Ag structure.

* * * * *